United States Patent
Dhong et al.

(10) Patent No.: US 8,443,306 B1
(45) Date of Patent: May 14, 2013

(54) PLANAR COMPATIBLE FDSOI DESIGN ARCHITECTURE

(75) Inventors: Sang Hoo Dhong, Hsin-Chu (TW); Jiann-Tyng Tzeng, Hsin-Chu (TW); Kushare Mangesh Babaji, Maharashtra (IN); Ramakrishnan Krishnan, Hsinchu (TW); Lee-Chung Lu, Taipei (TW); Ta-Pen Guo, Cupertino, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/437,975

(22) Filed: Apr. 3, 2012

(51) Int. Cl.
*G06F 17/50* (2006.01)
*H01L 23/52* (2006.01)
*H03K 19/00* (2006.01)

(52) U.S. Cl.
USPC ............. 716/20; 257/691; 257/206; 438/157; 438/129; 326/101; 326/103; 716/19; 716/17

(58) Field of Classification Search .................. 438/127, 438/129, 142, 154, 157, 458; 257/206, 256, 257/347, 348, 392, 691, 706, 773; 716/8, 716/11, 12, 16, 17, 19, 20; 326/101–103
See application file for complete search history.

(56) References Cited

U.S. PATENT DOCUMENTS

| | | | |
|---|---|---|---|
| 6,366,061 B1 * | 4/2002 | Carley et al. ................... | 323/223 |
| 6,480,989 B2 * | 11/2002 | Chan et al. ..................... | 716/120 |
| 6,835,633 B2 | 12/2004 | Boyd et al. | |
| 6,879,000 B2 | 4/2005 | Yeo | |
| 7,240,314 B1 * | 7/2007 | Leung ............................ | 257/773 |
| 7,760,578 B2 * | 7/2010 | Vinke et al. .................... | 365/226 |
| 7,799,657 B2 * | 9/2010 | Dao ................................ | 438/458 |
| 7,821,066 B2 | 10/2010 | Lebby et al. | |
| 7,939,393 B2 | 5/2011 | Xiong et al. | |
| 7,973,370 B2 * | 7/2011 | Forbes .......................... | 257/392 |
| 8,030,145 B2 | 10/2011 | Chang et al. | |
| 8,336,018 B2 * | 12/2012 | Turner et al. .................. | 716/133 |
| 2009/0302354 A1 * | 12/2009 | Chuang et al. ................ | 257/206 |

* cited by examiner

*Primary Examiner* — Vibol Tan
(74) *Attorney, Agent, or Firm* — Duane Morris LLP

(57) ABSTRACT

A multi-operation mode application specific integrated circuit (ASIC) implemented in fully-depleted silicon-on-insulator (FDSOI) includes an ASIC implemented in FDSOI having a plurality of operating modes, plurality of power rails, and a power supply that provides voltages for the first and second rails corresponding to the plurality of operating modes. The power rails include at least one VDD rail, at least one Vss rail, a first rail for biasing a NGP region of PMOS transistor devices in the ASIC, and a second rail for biasing a PGP region of NMOS transistor devices in the ASIC.

20 Claims, 4 Drawing Sheets

US 8,443,306 B1

PLANAR COMPATIBLE FDSOI DESIGN ARCHITECTURE

TECHNICAL FIELD

The present disclosure relates to devices and techniques for reducing standby power and increasing operating speed in multi-operating mode designs.

BACKGROUND OF THE INVENTION

Battery operated devices, such as mobile devices, based on bulk planar FET ASIC designs use a variety of techniques for implementing different operating modes having different VDD requirements. For example, using 2G and 3G cellular devices as an example, there are different VDD requirements for standby mode where a lower VDD is used to reduce leakage, talk mode where a higher VDD is needed to increase performance but lower switch power is desired, and high speed data applications where maximum operating speed is required.

Various techniques for providing these multi-operating modes exist in bulk planar designs. For example, complex multi-Vth designs may be utilized, but this approach requires additional masks and thus increases cost. For a single Vth design, voltage scaling techniques such as adaptive voltage scaling (AVS) and dynamic voltage and frequency scaling (DVFS) techniques have also been used but these techniques cannot cover a wide range of the speed-power envelope, i.e., they cannot extend the performance boost or leakage reduction too far from the nominal operating point. Adaptive body bias, where the body bias is reduced to reduce leakage current, is yet another technique, but this technique can only be used to reduce the chip speed by increasing the threshold voltage. It is possible to slightly boost performance using adaptive body bias in bulk planar designs by lowering the threshold voltage but with the risk of forward biasing the transistor. Finally, some designs use a header switch, such as a PMOS power switch, to shut down the entire chip in certain modes, but this approach increases area and decreases speed due to the voltage drop across the switch.

BRIEF DESCRIPTION OF THE DRAWINGS

The following will be apparent from elements of the figures, which are provided for illustrative purposes and are not necessarily to scale.

DETAILED DESCRIPTION

Figure 1:
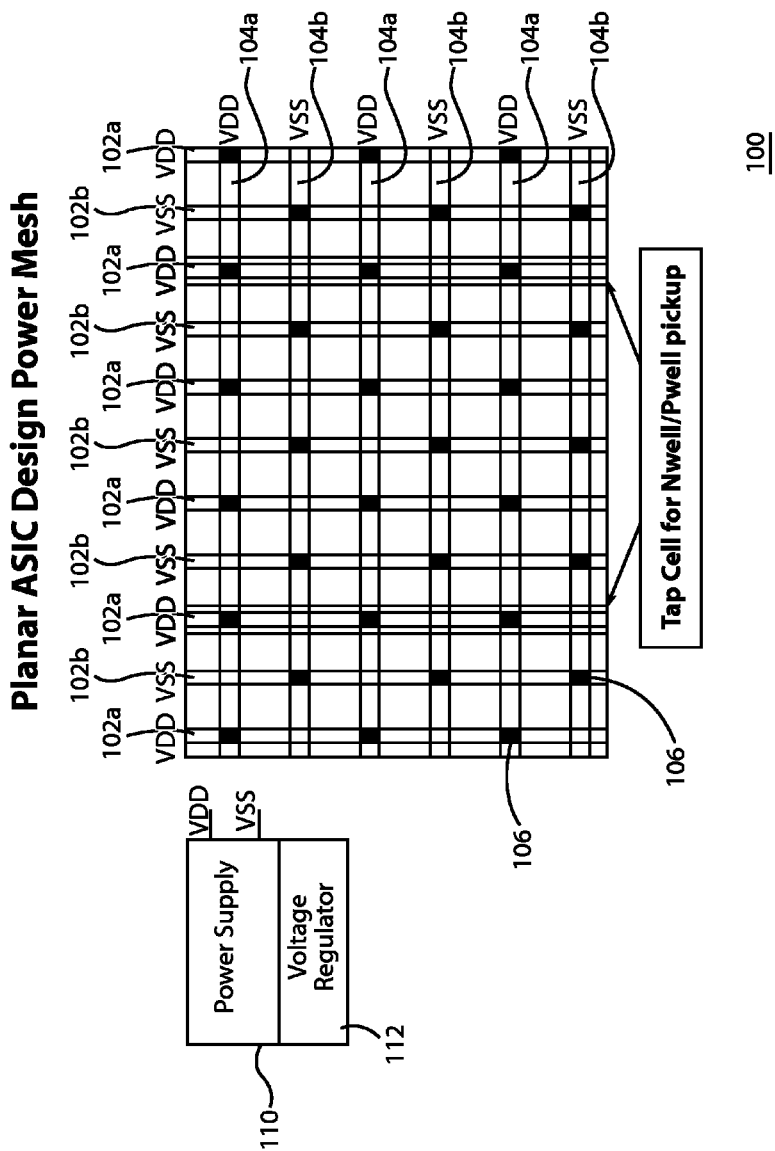
FIG. 1 is a schematic illustration of an embodiment of a planar ASIC design power plan.

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Traditional silicon-on-insulator (SOI) integrated circuits are formed on SOI substrates. SOI substrates typically have a thin layer of silicon, also known as the active layer, disposed on an insulator layer such as a buried oxide layer (BOX). The insulator layer or the buried oxide layer is disposed on a silicon substrate. Active devices, such as transistors, are formed in active regions within the silicon layer or the active layer. The size and placement of the active regions are defined by isolation regions, such as shallow trench isolation (STI) regions. Active devices in the active regions are isolated from the substrate by the BOX layer. Devices formed on SOI substrates offer many advantages over their bulk counterparts, including absence of reverse body effect, absence of latch-up, soft-error immunity, and elimination of junction capacitance typically encountered in bulk silicon devices. SOI technology therefore enables higher speed performance, higher packing density, and reduced power consumption.

There are generally two types of SOI transistors: partially-depleted (PD) SOI transistor and fully-depleted (FD) SOI transistor. A PDSOI transistor is formed in an active region with an active layer thickness that is larger than the maximum depletion width. The PDSOI transistor therefore has a partially depleted body. PDSOI transistors have the merit of being highly manufacturable, but they suffer from floating body effects. Digital circuits which typically have higher tolerance for floating body effects may employ PDSOI transistors. A FDSOI transistor is formed in an active region with an active layer thickness that is smaller than the maximum depletion width. FDSOI transistors avoid problems of floating body effects with the use of a thinner active layer thickness or a lighter body doping. Generally, analog circuitry performs better when designed using FDSOI devices than using PDSOI devices. PDSOI and FDSOI devices can be formed on the same type of device substrate.

As described herein, a cost effective way when compared to bulk planar design techniques to reduce the standby power and boost maximum operation speed to accommodate multi-mode device operation is desired. In embodiments, the design utilizes a FDSOI design in the same footprint as would be used by a bulk planar ASIC design for the same functionality. That is, the FDSOI ASIC design architecture is fully compatible with existing bulk planar designs, which allows for direct mapping of the FDSOI design directly to the bulk planar design. Similar power plans can be used with no area overhead penalties.

In embodiments, two voltage generators (VH and VL) could be used for the FDSOI NGP/PGP bias to adjust the devices threshold voltage (Vt) optimally for different operation modes. This approach can be used to balance or unbalance PMOS, NMOS devices on the fly, changing its Vts, and changing the beta ratio (i.e., the NMOS and PMOS driving capabilities of CMOS designs) by changing the NGP (N-top ground plane)/PGP (P-top ground plane) biases. This provides for better performance with the desired beta ratio. Global PMOS and NMOS mismatches due to process variations can also be corrected by changing the NGP/PGP biases, thereby providing the desired beta ratio. The approach provides for simpler designs with single Vth, minimal or no area penalty, and much improved cost-to-performance benefits.

FIG. 1 illustrates a power plan 100 for a bulk silicon ASIC design architecture. As can be seen from FIG. 1, the power plan 100 includes vertical metal lines 102 and horizontal metal lines 104. Some of the vertical metal lines 102 are assigned to VDD (designated 102a) and some to Vss (designated 102b). Likewise, some of the horizontal metal lines are assigned to VDD (designated 104a) and some to VSS (designated 104b). Typically, the vertical metal lines 102 are in the top metal interconnect layer and the horizontal metal lines 104 provide the VDD and VSS power rails of standard cell (i.e., they reside in the Metal I (M1) or Metal II (M2) interconnect layer). The interconnect layers are coupled together through via connections, which are schematically illustrated and designated with reference 106

The tap cell is also illustrated, which is a special cell for power rail connections to the Nwell and Pwell. There are two possible cases. In normal usage, which is shown in FIG. 1, VDD is connected to the Nwell and Vss is connected to the Pwell. If adaptive body bias is used, then a VH power rail is connect to the Nwell and VL power rail is connected to the Pwell.

Also illustrated in the power plan 100 of FIG. 1 is a power supply 110 for providing VDD and VSS. VDD and VSS can be provided by external power or a voltage regulator 112 can be used that takes I/O power (e.g., 3.3V, 2.5V, or 1.8V) and generate the core voltages VDD and VSS.

Figure 2:
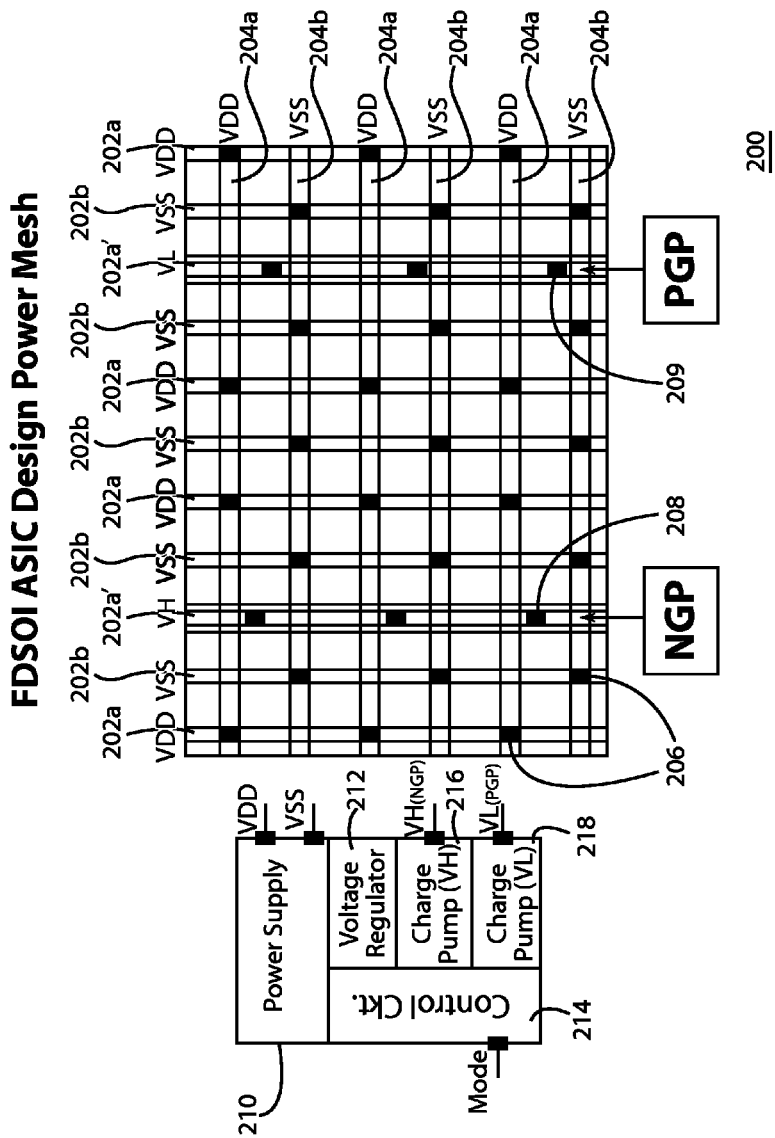
FIG. 2 is a schematic illustration of an embodiment of a FDSOI ASIC design power plan.

FIG. 2 illustrates a power plan 200 for a bulk compatible FDSOI ASIC design architecture for direct mapping from a compatible bulk planar ASIC design. As can be seen from FIG. 2, the FDSOI design architecture uses a similar power plan in the same footprint, i.e., there is no area overhead penalty by implementing the ASIC design in FDSOI rather than bulk planar. The power plan 200 includes vertical metal lines 202 and horizontal metal lines 204. Some of the vertical metal lines 202 are assigned to VDD (designated 202a) and some to Vss (designated 202b). Likewise, some of the horizontal metal lines 204 are assigned to VDD (designated 204a) and some to VSS (designated 204b). In embodiments the vertical metal lines 202 are in the top metal interconnect layer and the horizontal metal lines 204 provide the VDD and VSS power rails of the standard cell (i.e., they reside in the Metal I (M1) or Metal II (M2) interconnect layer). The interconnect layers are coupled together through via connections, which are schematically illustrated and designated with reference 206

Also illustrated in the power plan 200 of FIG. 2 is a power supply 210 for providing VDD and VSS. VDD and VSS values can be provided by external power supply or a voltage regulator 212 can be used that takes I/O power (e.g., 3.3V, 2.5V, or 1.8V) and generate the core voltages VDD and VSS.

In the illustrated embodiment, two of the vertical VDD lines 202a' are assigned to VH and VL, and these lines are connected through via connections 208 and 209 to the device layer (i.e., to the tap cell NGP/PGP) to provide the NGP and PGP biases, respectively, of the underlying FDSOI devices. The device threshold Vt of the NMOS and PMOS transistor devices can be adjusted using VH and VL so that it is optimal for different operating modes. In one embodiment, the VH and VL voltages are generated on chip by a positive charge pump 216 and a negative charge pump 218, respectively. In embodiments, the VH/VL bias range is adjusted as necessary for standby power reduction, low active power (e.g., during talk mode), and maximum operating frequency (e.g., during data communications) under control of a control circuit 214 responsive to a mode control signal MODE, which comes from an external circuit or system in embodiments The VH bias should be greater than or equal to the VL bias to ensure that the P/N junction is reverse biased. If the junction is forward biased, the device will be subject to increased leakage, which affects any power savings. That is, VH can be dynamically adjusted as well as VL as long as VH≧VL. This approach allows for both the raising and lowering of the Vt level, whereas adaptive bias techniques with bulk planar devices risk forward biasing the transistor with little benefit in performance when lowering the Vt level. In the FDSOI design, the chip can be made faster using forward biasing of the ground plane (also known as the buried plate) without forward biasing any PN junctions.

The design also allows the balancing or unbalancing of the PMOS, NMOS devices on the fly, changing the beta ratio by changing the NGP/PGP bias to change their VTs. Improved performance can be achieved by realizing the preferred beta ratio and global PMOS and NMOS mismatches can be addressed.

In embodiments, a triple well is used. In such embodiments, the VNGP (i.e., VH) need not be greater than or equal to VPGP (i.e., VL) for NMOS devices because PN junctions are isolated. The area consumed by the device layout is larger with a triple well design but the approach allows for more forward bias to the ground plane and a lower Vt to extend the operating range.

Figures 3A, 3B:
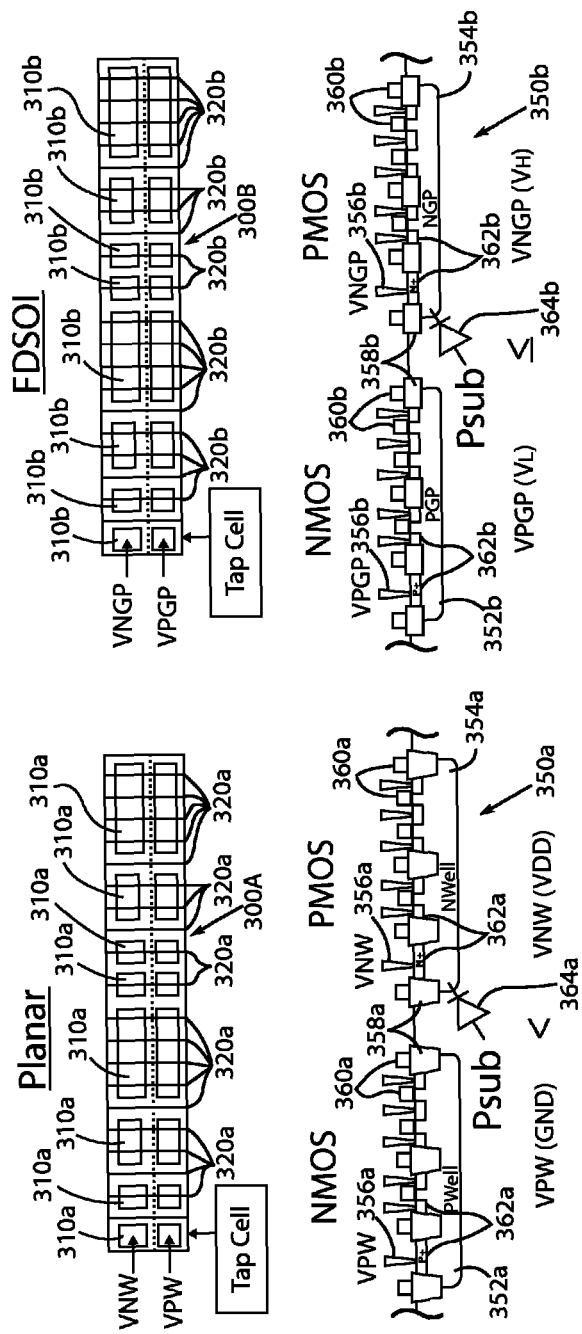
FIGS. 3A and 3B illustrate an example of device region layout and cross-sectional device layers for bulk planar and FDSOI ASIC designs in the same footprint.

FIG. 3A illustrates an example of device region layout 300A for a bulk planar ASIC design. The device region layout 300A includes OD regions 310a and polysilicon gate lines 320a, some of which are dummy lines (i.e., not formed over OD regions 310. FIG. 3B illustrates an example of a device region layout 300B for the same ASIC as the planar ASIC design but implemented using a FDSOI design. The device region layout 300B has OD regions 310b and polysilicon gate lines 320b. As can be seen from FIGS. 3A and 3B, the identical device region layout can be used for the FDSOI ASIC design as for the bulk planar ASIC design, only in the FDSOI design the tap cells for the PGP voltage (VPGP) and NGP voltage (VNGP) replace the tap cells for the planar designs PWell and NWell voltages VPW and VNW, respectively.

FIGS. 3A and 3B also illustrate cross-sectional device layers 350A, 350B for a bulk planar ASIC design and a corresponding FDSOI ASIC design, respectively. Turning first to the bulk planar ASIC design, the device layer 350A includes both NMOS and PMOS devices, with the NMOS devices formed in a PWell 352a and the PMOS devices formed in an NWell 354a. Via contacts 356a are shown for biasing the devices, including providing voltage VPW for biasing the PWell 352a and voltage VNW for biasing the NWell 354a. Isolation regions 358a, polysilicon gate (both actual and dummy) lines 360a and dopant implant regions 362a are also illustrated. In the bulk planar design the PWell voltage VPW is less than the NWell voltage VNW, e.g., VPW is set to ground and VPW is set to VDD. The P-substrate to NWell diode 364a should always be reverse biased.

Turning to the FDSOI design, the device layer 350B layout has via contacts 356b, isolation regions 358b, polysilicon lines 360b, dopant implant regions 362b arranged identically to those features of the bulk planar ASIC design. The NGP and PGP regions 352b, 354b are biased with voltages VPGP and VNGP, respectively. As discussed above, in embodiments VPGP is set to VL and VNGP is set to VH. Unlike with the bulk planar design, voltage VPGP can be less than or equal to VNGP while the P-substrate to NGP diode 364b is always reverse biased.

An FDSOI ASIC design in the same footprint as a bulk planar ASIC design provides several advantages over the bulk planar ASIC design. Adaptive body bias techniques are inefficient with bulk planar designs because of the PN junction forward bias issue discussed above and because junction leakage increases in the reverse bias condition. Therefore, planar technologies have to adopt voltage scaling techniques for power savings in single Vt designs. By way of example, the voltage scaling for a mobile application implemented in a planar bulk design is illustrated in the table below.

| Usage Mode For Mobile Application | Standby Mode | Talk Mode | Data Max Mode (maximum operating speed) |
|---|---|---|---|
| VDD Value | 0.8 × VDD | 0.9 × VDD | 1.1 × VDD (overdrive) |

Figure 4:
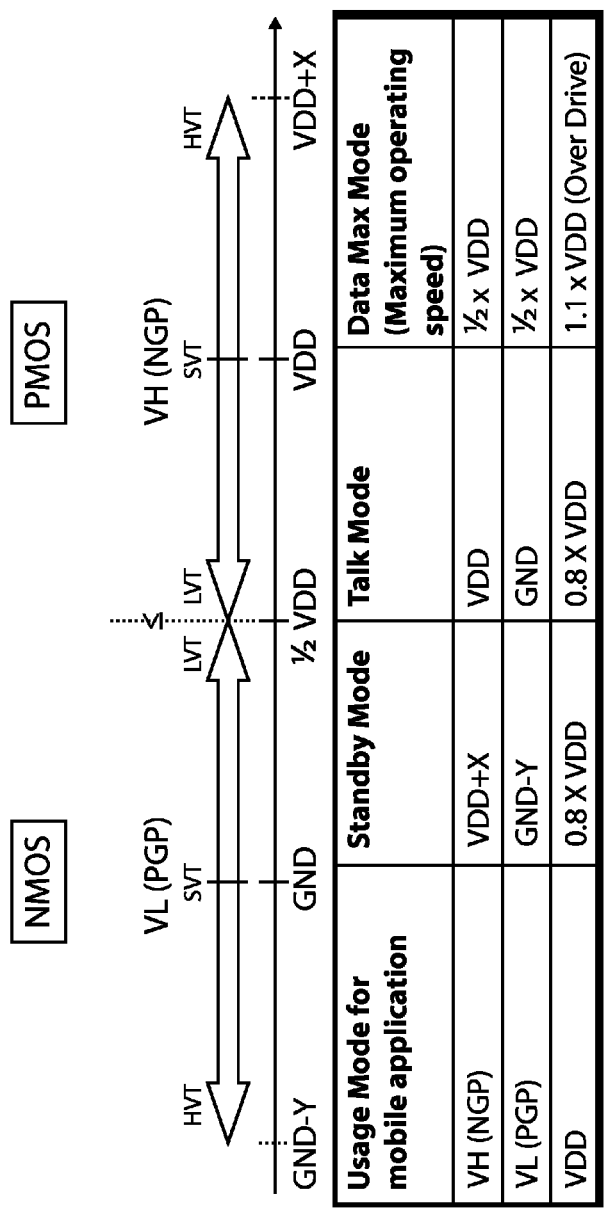
FIG. 4 illustrates biasing conditions for various modes of a mobile device using a FDSOI design.

In contrast, in the FDSOI design in the same footprint, NGP/PGP adaptive body bias can be used to adjust the NMOS and PMOS devices' threshold voltage (Vt) optimally for different operation modes alone or in combination with voltage scaling, providing mode control for switching to standby power and maximum operating speed modes. FIG. 4 illustrates a continuum of voltages from GND−Y to VDD+X for biasing the NMOS and PMOS devices at high Vt (HVT), standard Vt (SVT) and low Vt (LVT) thresholds while ensuring that the P/N diode remains reverse biased. Settings for the VDD, NGP and PGP biases are shown in a table for each of the operating modes. In standby mode, the VDD rail is set to 0.8×VDD (e.g., from voltage regulator 112) to reduce power. VH and VL are set above VDD and below ground (GND) (e.g., to VDD+X and GND−Y) to raise the threshold voltages of the NMOS and PMOS transistors above the SVT value. In standard talk (normal) operating mode, VH and VL are set to VDD and GND, respectively, tuning the NMOS and PMOS devices to their standard threshold voltage SVT. The VDD rail is set to 0.8×VDD. It should be noted that when compared to talk mode in the bulk planar design in the same footprint, this VDD setting represents a 10% power savings. In Data Max. Mode, VH and VL can both be set to values below VDD and above VSS, respectively, and in some embodiments to the same value, e.g., 0.5×VDD, to lower the threshold voltages of the NMOS and PMOS transistors. It should be noted that the 0.5×VDD value is merely illustrative of a ground plane bias for providing LVT, and other biases on the voltage continuum illustrated in FIG. 4 can be used as long as the P/N diode is reverse biased. The VDD rail is set to 1.1×VDD.

The bulk planar and FDSOI designs discussed above were simulated to compare the leakage power and speed performances of the designs. When using a FDSOI design and compared with a bulk planar design, the simulation showed for standby mode (i) that leakage power could be reduced significantly using only dynamic biasing of NGP and PGP to increase the threshold voltage Vt to the HVT values (i.e., no VDD voltage scaling) and (ii) that leakage power could be reduced by an order of magnitude using both dynamic biasing of the NGP and PGP to increase the threshold voltage Vt in combination with voltage scaling (e.g., setting 0.8×VDD) in standby. For talk mode, the simulation showed a 20% power savings (dynamic power $CV^2$) when compared with a bulk planar design at the same speed. Finally, for maximum operating speed mode, the simulation showed (i) an increase in operating speed using only dynamic biasing of the NGP and PGP to lower the threshold voltage Vt to the LVT values (i.e., no VDD voltage scaling), and (ii) a further increase in operating speed of 15% using both dynamic NGP/PGP biasing in connection with VDD voltage scaling (e.g., setting 1.1×VDD).

As described herein, embodiments of a multi-operation mode application specific integrated circuit (ASIC) implemented in fully-depleted silicon-on-insulator (FDSOI) include an ASIC implemented in FDSOI having a plurality of operating modes. A plurality of power rails are provided including at least one VDD rail, at least one Vss rail, a first rail for biasing a NGP region of PMOS transistor devices in the ASIC, and a second rail for biasing a PGP region of NMOS transistor devices in the ASIC. A power supply provides voltages for the first and second rails corresponding to the plurality of operating modes.

As also described herein, embodiments of a method of biasing a multi-operation mode ASIC implemented in FDSOI are also provided and include the step of adaptively biasing a NGP region of PMOS transistor devices in the ASIC and a PGP region of NMOS transistor devices in the ASIC dependent on different operating modes of the ASIC. In a first operating mode the NGP and PGP regions are biased to increase the threshold voltage of the NMOS and PMOS transistor devices and in a second operating mode the NGP and PGP regions are biased to lower the threshold voltage of the NMOS and PMOS transistor devices.

Although examples are illustrated and described herein, embodiments are nevertheless not limited to the details shown, since various modifications and structural changes may be made therein by those of ordinary skill within the scope and range of equivalents of the claims.

What is claimed is:

1. A multi-operation mode application specific integrated circuit (ASIC) implemented in fully-depleted silicon-on-insulator (FDSOI), comprising:
   an ASIC implemented in FDSOI, the ASIC having a plurality of operating modes;
   a plurality of power rails comprising at least one VDD rail, at least one Vss rail, a first rail for biasing a N-top ground plane (NGP) region of PMOS transistor devices in the ASIC, and a second rail for biasing a P-top ground plane (PGP) region of NMOS transistor devices in the ASIC; and
   a power supply for providing voltages for the first and second rails corresponding to the plurality of operating modes.

2. The multi-operation mode ASIC of claim 1, wherein the ASIC occupies a layout and has a power mesh design that is compatible with a corresponding bulk planar ASIC design.

3. The multi-operation mode ASIC of claim 1, wherein the plurality of operating modes comprises a low power standby mode, a normal mode and a high operating speed mode.

4. The multi-operation mode ASIC of claim 1, wherein during a low power standby mode the NGP and PGP regions are biased to increase the threshold voltage of the NMOS and PMOS transistor devices.

5. The multi-operation mode ASIC of claim 4, wherein during the low power standby mode the NGP region is biased at a voltage above VDD and the PGP region is biased at a voltage below VSS.

6. The multi-operation mode ASIC of claim 5, wherein during the low power standby mode the at least one VDD rail is biased at a value that is below VDD.

7. The multi-operation mode ASIC of claim 1, wherein during a normal mode the NGP and PGP regions are biased at VDD and VSS, respectively and the at least one VDD rail is biased at a value that is below VDD.

8. The multi-operation mode ASIC of claim 1, wherein during a high operating speed mode the NGP and PGP regions are biased to lower the threshold voltage of the NMOS and PMOS transistor devices.

9. The multi-operation mode ASIC of claim 8, wherein during the high operating speed mode the NGP region is biased at a first value below VDD and the PGP region is biased at a second value above VSS.

10. The multi-operation mode ASIC of claim 9, wherein the transistor devices are formed over a p-type substrate and a diode junction from the p-type substrate to the NGP regions is reverse biased in the high operating speed mode.

11. The multi-operation mode ASIC of claim 9, wherein during the high operating speed mode the at least one VDD rail is biased at a value that is above VDD.

12. The multi-mode operation ASIC of claim 9, wherein the first and second values are equal to VDD/2.

13. The multi-operation mode ASIC of claim 12, wherein the transistor devices are formed over a p-type substrate and a diode junction from the p-type substrate to the NGP regions is reverse biased in the high operating speed mode.

14. The multi-operation mode ASIC of claim 1, wherein the plurality of modes includes a low power standby mode for which the NGP and PGP regions are biased to increase the threshold voltage of the NMOS and PMOS transistor devices and a high operating speed mode during which the NGP and PGP regions are biased to lower the threshold voltage of the NMOS and PMOS transistor devices.

15. The multi-operation mode ASIC of claim 14, wherein the FDSOI transistor devices have a triple well structure and the PGP region is biased at a value that is greater than a bias value of the NGP region.

16. A method of biasing a multi-operation mode application specific integrated circuit (ASIC) implemented in fully-depleted silicon-on-insulator (FDSOI):
adaptively biasing a N-top ground plane (NGP) region of PMOS transistor devices in the ASIC and a P-top ground plane (PGP) region of NMOS transistor devices in the ASIC dependent on different operating modes of the ASIC, wherein in a first operating mode the NGP and PGP regions are biased to increase the threshold voltage of the NMOS and PMOS transistor devices and in a second operating mode the NGP and PGP regions are biased to lower the threshold voltage of the NMOS and PMOS transistor devices.

17. The method of claim 16, wherein during the first operating mode the NGP region is biased at a voltage above VDD and the PGP region is biased at a voltage below VSS, and during the second operating mode the NGP region is biased at a first value below VDD and the PGP region is biased at a second value above VSS.

18. The method of claim 17, wherein the first value equals the second value.

19. The method of claim 16, wherein the first operating mode is a low power standby mode and the second operating mode is a high operating speed mode, the method further comprising the step of voltage scaling a VDD bias value coupled to the NMOS and PMOS transistors dependent upon the operating mode.

20. The method of claim 19, further comprising the step of biasing the NGP and PGP regions at VDD and VSS, respectively, during a third operating mode, the third operating mode being a normal mode.

* * * * *